United States Patent
Liang et al.

(10) Patent No.: US 10,132,853 B2
(45) Date of Patent: Nov. 20, 2018

(54) WIDE AREA FAULT DETECTION METHOD USING PMU DATA

(71) Applicants: Xiaodong Liang, St. John's (CA); Scott Andrew Wallace, Portland, OR (US); Xinghui Zhao, Vancouver, WA (US)

(72) Inventors: Xiaodong Liang, St. John's (CA); Scott Andrew Wallace, Portland, OR (US); Xinghui Zhao, Vancouver, WA (US)

(73) Assignee: WASHINGTON STATE UNIVERSITY, Pullman, WA (US)

( * ) Notice: Subject to any disclaimer, the term of this patent is extended or adjusted under 35 U.S.C. 154(b) by 297 days.

(21) Appl. No.: 15/095,266

(22) Filed: Apr. 11, 2016

(65) Prior Publication Data
US 2016/0299187 A1    Oct. 13, 2016

Related U.S. Application Data

(60) Provisional application No. 62/146,156, filed on Apr. 10, 2015.

(51) Int. Cl.
| | |
|---|---|
| *G01R 31/08* | (2006.01) |
| *G01R 31/02* | (2006.01) |
| *H02H 1/00* | (2006.01) |
| *H02H 7/26* | (2006.01) |

(52) U.S. Cl.
CPC .......... *G01R 31/086* (2013.01); *G01R 31/025* (2013.01); *H02H 1/0092* (2013.01); *H02H 7/26* (2013.01); *Y02E 60/728* (2013.01); *Y04S 10/265* (2013.01); *Y04S 10/522* (2013.01)

(58) Field of Classification Search
CPC ............................. Y04S 10/265; Y04S 10/522
See application file for complete search history.

(56) References Cited

U.S. PATENT DOCUMENTS

| | | | | |
|---|---|---|---|---|
| 2009/0027067 A1* | 1/2009 | Li | ............ | G01R 27/16 324/650 |
| 2010/0152910 A1* | 6/2010 | Taft | ............ | G01D 4/002 700/286 |
| 2014/0229127 A1* | 8/2014 | Ren | ............ | H02H 3/40 702/59 |
| 2016/0116522 A1* | 4/2016 | Abido | ............ | G01R 31/088 702/59 |
| 2017/0227611 A1* | 8/2017 | Xu | ............ | G01R 31/40 |

* cited by examiner

*Primary Examiner* — Benjamin Sandvik
(74) *Attorney, Agent, or Firm* — Whitham & Cook, P.C.

(57) ABSTRACT

The embodiments herein are directed to monitoring in real time, power system data so as to provide insights into global operation of a power grid. Such a scheme disclosed herein utilizes rules, which are created by analyzing PMU measurement data, in order to detect the fault location (bus and line) and fault type. Three common types of faults in a power grid, single-line-to-ground (SLG), line-to-line (LL), and three phase faults, can be detected using the methods herein.

9 Claims, 5 Drawing Sheets

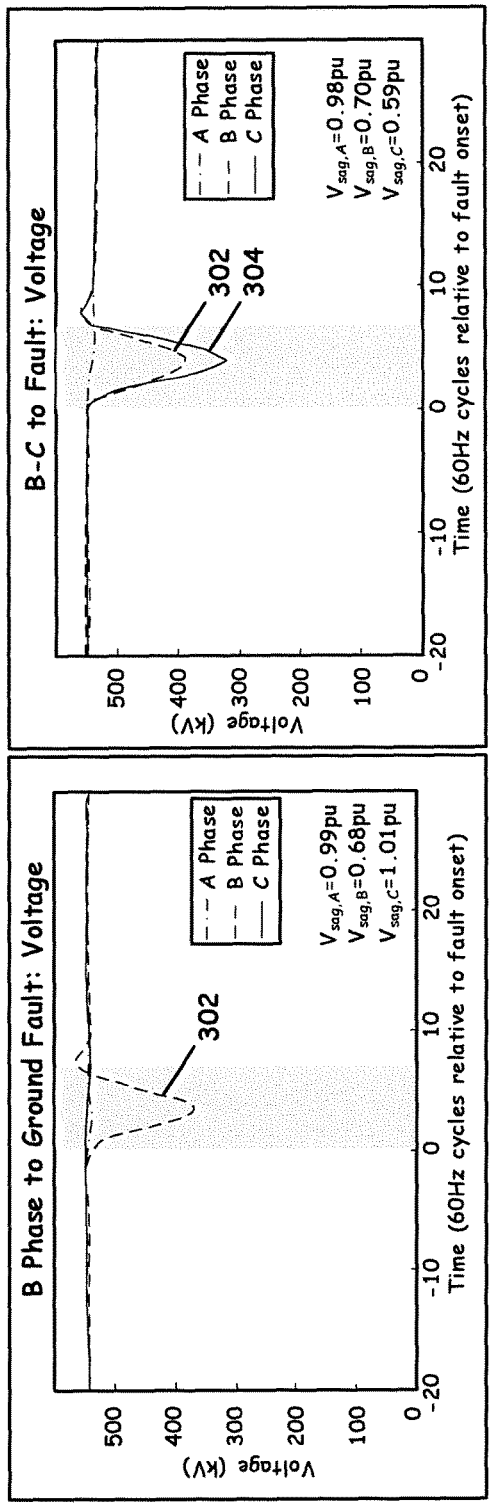
FIG. 3A
FIG. 3B
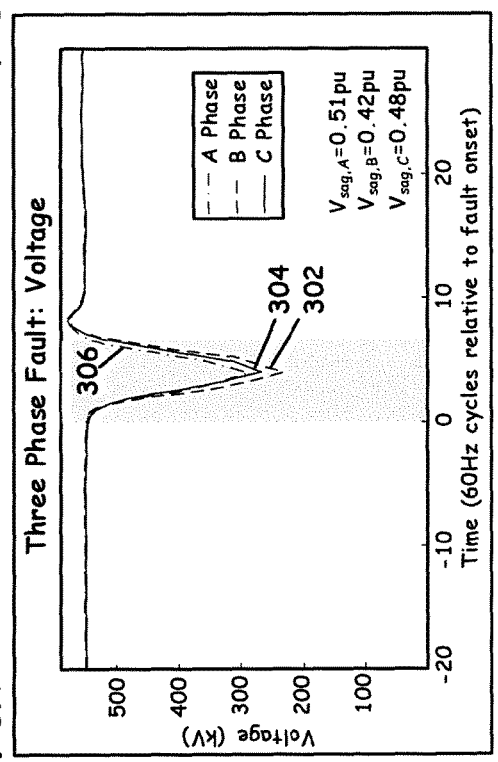
FIG. 3C

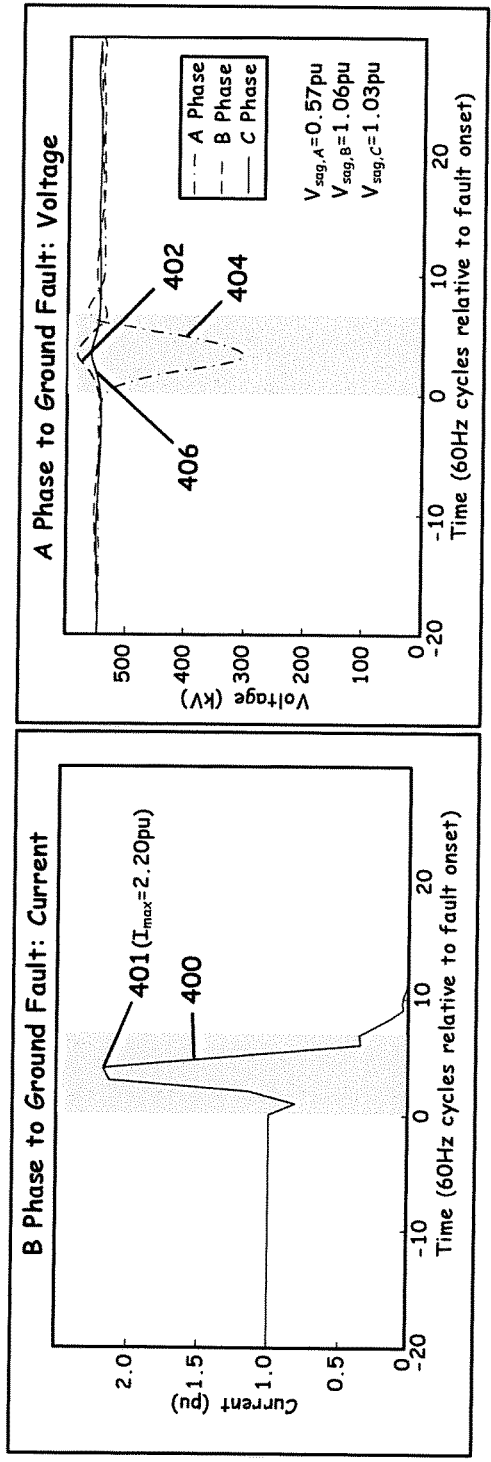
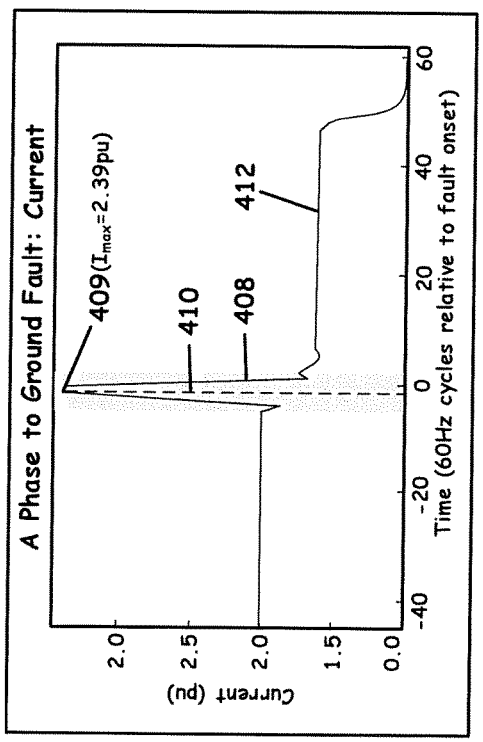
FIG. 4A
FIG. 4B
FIG. 4C

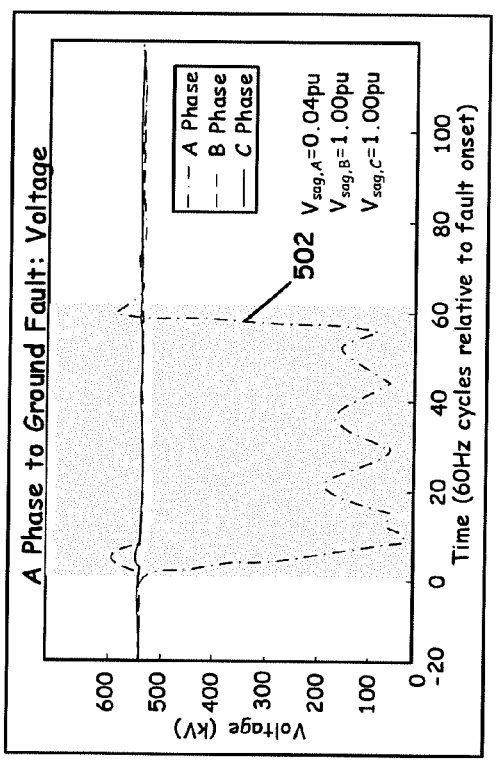
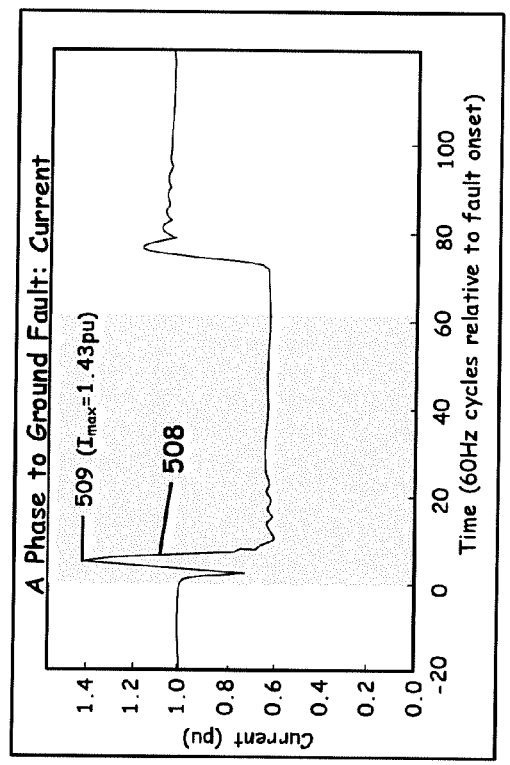

WIDE AREA FAULT DETECTION METHOD USING PMU DATA

GOVERNMENT INTERESTS

This invention was made with government support under contract No. 00059803 awarded by the U.S. Department of Energy through the Bonneville Power Administration. The government has certain rights in the invention.

BACKGROUND OF THE INVENTION

Field of the Invention

The present embodiments herein relate to the field of supervision and control of wide-area power systems, and more particularly, to a rule-based data-driven system and method for wide-area fault detection in power systems.

Discussion of the Related Art

Voltage stability studies have been investigated by researchers in the past as several blackouts have been caused or accompanied by voltage instability phenomenon. However, with the advent of Wide-Area Measurement System (WAMS) technology, also known as the synchrophasor technology, as wide area system information is available in real time in the form of voltage and current phasors, improved algorithms can be developed that can make optimum utilization of this bank of system information to efficiently monitor and in real time, control the power system so as to avert a voltage unstable situation that can possibly lead to a blackout.

The basic component of WAMS is a sophisticated digital recording device called the Phasor Measurement Unit (PMU). PMUs have the ability to record and communicate GPS-synchronized, high sampling rate (6-60 samples/sec), dynamic power system data including the magnitude and phase angle of voltage and current, frequency and other parameters, which are transferred to a data control center. Because PMU data are more widely available in near real-time, it can provide unique insights into the global operation of the power grid. It can be used for: 1) stability monitoring and assessment; 2) preventive and emergency control; 3) increasing transmission capability of existing assets; and 4) fault detection.

The greatest threat to power systems is system faults which could occur at any voltage level. Rapid growth of power systems has resulted in a large increase in the number of transmission lines in operation and their total length. These lines experience faults due to various reasons. On overhead line systems, the majority of short-circuit faults, typically 80-90%, tend to occur on overhead lines and the rest on substation equipment and bus bars combined. To expedite repairs and fast restoration of power supply, it is important that the location of a fault is either known or can be estimated with reasonable accuracy. Extensive research work has been conducted on fault detection using PMU data, but the majority of the previous research focuses on fault detection for transmission lines. Either single terminal data or double terminal data of a transmission line are used for fault detection on a particular line and the location of a fault point is usually calculated from the voltage and current measurements at line terminals. However, fault detection methods for a wide-area grid have not received the same amount of attention.

Power grid intelligent fault diagnosis, detection and characterization are important functions for future smart grid. The current practice of electric utilities is to depend on alarms of relays and circuit breakers at control centers. A large number of alarms are usually received in a control center due to power system faults. The operators have to process these alarm data to get the required information about the faults. To improve such situation and provide operators fast and accurate knowledge of the fault condition of the system in order to allow them handle a potential crisis in a timely manner, fault detection and characterization algorithms developed from the real-time synchrophasor data can realize much better protection and control of tomorrow's power grid.

There is currently limited research reported on fault detection methods using synchrophasor data including all of the following features: identify fault type, determine the fault location on a bus, and/or determine fault location on a long transmission line. Now with the power grid gradually becoming "smarter," there is a need in the industry for developing a new voltage wide-area fault real-time event detection tool using a data-driven approach that is able to monitor the wide area voltage stability condition of a power system's synchrophasor data and then take fast and suitable wide area coordinated control actions in real time to avoid a possible voltage collapse. The embodiments herein address such a need by way of dimensionality reduction analysis through adaptive training to realize real-time event detection using a data-driven approach for effectively processing of such synchrophasor data.

SUMMARY OF THE INVENTION

It is to be appreciated that the present example embodiments herein are directed to a method for wide-area real time line fault detection in a power grid system; comprising: (a) using a measurement device to measure one or more current phasors and one or more voltage phasors at a monitored bus of a load center; and (b) using a logic processor device to: (I) acquire the measured one or more current and voltage phasors obtained by the measurement device; (ii) identify an event as one or more faulted buses in the power system via calculating a maximum three phase total average voltage deviation ($\Delta V_t$), wherein a magnitude of the one or more measured voltage phasors is utilized to calculate the maximum three phase total average voltage deviation ($\Delta V_t$); (iii) determine the event as one or more fault types using at least one methodology selected from: a first method that uses the magnitude of the one or more voltage phasors and a second method that uses both the magnitude and a phase angle of the measured one or more voltage phasors, wherein the first method and the second method enables determination of the one or more fault types with at least one fault type selected from: single line-to-ground faults (SLG), line-to-line faults (LL), and three-phase faults; and (iv) detect the one or more faulted lines using the magnitude of positive sequences of the one or more current phasors as the parameter.

According to another aspect of the present application, a wide-area real time line fault detection computing system is provided of which includes: a logic processor device; a memory operatively coupled to the processor, the memory containing instructions that when executed by the processor causes the logic processor device to perform a process including: acquiring measured one or more current phasors and one or more voltage phasors at a monitored bus of a load center configured within a power grid system; identifying an event as one or more faulted buses in the power system via calculating a maximum three phase total average voltage deviation ($\Delta V_t$), wherein the magnitude of the one or more measured voltage phasors is utilized to calculate the maximum three phase total average voltage deviation ($\Delta V_t$);

determining the event as one or more fault types using at least one methodology selected from: a first method that uses the magnitude of the one or more voltage phasors and a second method that uses both the magnitude and a phase angle of the measured one or more voltage phasors, wherein the first and the second method enables determination of the one or more fault types with at least one fault type selected from: single line-to-ground faults (SLG), line-to-line faults (LL), and three-phase faults; and detecting the one or more faulted lines using the magnitude of positive sequences of the one or more current phasors as the parameter.

BRIEF DESCRIPTION OF THE DRAWINGS

FIG. 3A shows an example of a phase B single line-to-ground fault (SLG) plotted based on recorded PMU data. Such recorded data will be used to develop the present technology.

FIG. 3B shows an example of a Phases B-C Line to Line Faults (LL) plotted based on recorded PMU data. Such recorded data will be used to develop the present technology.

FIG. 3C shows example of a Three Phase Fault (ABC) plotted based on recorded PMU data. Such recorded data will be used to develop the present technology.

FIG. 4A illustrates a plot of a Current per-unit (pu) versus Time so as to indicate a three-phase circuit breaker trip for a Phase B-to-ground fault. It is plotted based on recorded PMU data. Such recorded data will be used to develop the present technology.

FIG. 4B illustrates a Voltage versus Time plot so as to indicate a Phase A-to-ground fault. It is plotted based on recorded PMU data. Such recorded data will be used to develop the present technology.

FIG. 4C illustrates a plot of a Current "pu" versus Time so as to indicate a positive sequence fault current at the fault location resulting in a hybrid trip with successful reclose. It is plotted based on recorded PMU data. Such recorded data will be used to develop the present technology.

FIG. 5A shows a voltage per phase for Phase A-to-ground fault plotted based on recorded PMU data. Such recorded data will be used to develop the present technology FIG. 5B shows a positive sequence fault current at the fault location resulting in a single pole of the breaker trip with successful reclose. It is plotted based on recorded PMU data. Such recorded data will be used to develop the present technology.

DETAILED DESCRIPTION

Figure 1:
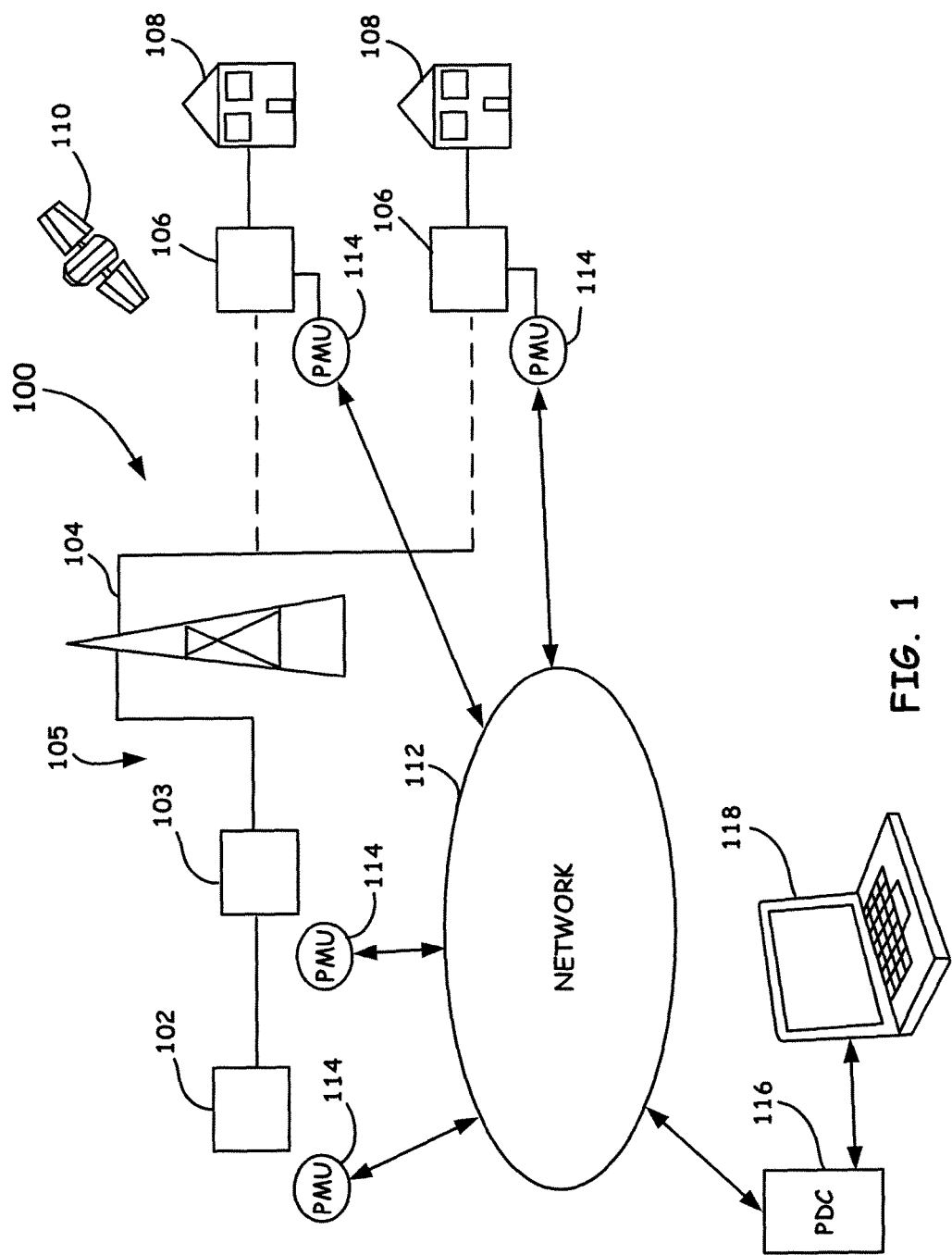
FIG. 1 shows an example schematic diagram of a power system that can utilize the wide area fault detection method embodiments of the present technology.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. It is to be noted that as used herein, the term "adjacent" does not require immediate adjacency. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise.

In addition, unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

Specific Description

FIG. 1 thus illustrates a schematic diagram of a power system, generally designated by the reference numeral 100, to be integrated with the novel wide area fault detection method, as disclosed herein. FIG. 1 in general includes a power generating plant 102, a step-up substation 103, a transmission tower 104, a plurality of step-down substations 106, and a plurality of power consuming loads 108 interconnected with one another by a power grid 105. Even though only certain system components (e.g., one power generating plant 102 and one step-up substation 103) are illustrated in FIG. 1, in other embodiments, the power system 100 and/or the power grid 105 can include other system components in addition to or in lieu of those components shown in FIG. 1.

The power system 100 can also include a plurality of phasor measurement units ("PMUs" or synchrophasors) PMUs 114 to also include supervisory control and data acquisition ("SCADA") facilities (not shown), and/or other suitable sensors individually coupled to various system components of the power system 100. Such components are often configured to measure current and voltage phasors at a bus of a load center. For example, as illustrated in FIG. 1, the power generating plant 102, the step-up substation 103, and the two example step-down substations 106 include PMUs 114. It is to be noted that a configured SCADA device (not shown) can measure voltage, current, power, and/or other suitable parameters. The PMUs 114 can be configured to measure voltage, current, voltage phase, current phase, and/or other types of phasor data in the power system 100 based on a common time reference (e.g., a GPS satellite 110). It is to be appreciated that while PMUs 114 can make such measurements, it is to be duly noted that synchrophasor measurements can also be provided by other known components in the art, such as, but not limited to, protective relays and meters so as to also take such synchrophasor measurement data for monitoring.

The power system 100 can also include a phasor data concentrator ("PDC") 116 operatively coupled to the PMUs 114 via a network 112 (e.g., an internet, an intranet, a wide area network, and/or other suitable types of network). The PDC 116 can be configured to receive and process data from the PMUs 114 and other associated hardware (not shown). For example, in certain embodiments, the PDC 116 can include a logic processing device (e.g., a network server, a personal computer, etc.) located in a control center and configured to receive and "align" phasor measurements from the PMUs 114 based on corresponding time stamps with reference to the GPS satellite 110. The PDC 116 can then store and/or provide the actual system parameters for further processing by other components of the power system 100.

In the illustrated embodiment, the power system 100 includes a computing station 118 operatively coupled to the PDC 116. The computing station 118 can include a network server, a desktop computer, and/or other suitable computing devices of various circuitry of a known type, such as, but not limited to, by any one of or a combination of general or special-purpose processors (digital signal processor (DSP)), firmware, software, and/or hardware circuitry to provide instrument control, data analysis, etc., for the example configurations disclosed herein.

It is to be noted that in using such example computing devices, it is to also to be appreciated that as disclosed herein, the incorporated individual software modules, components, and routines may be a computer program, procedure, or process written as source code in C, C#, C++, Java, and/or other suitable programming languages. The computer programs, procedures, or processes may be compiled into intermediate, object or machine code and presented for execution by any of the example suitable computing devices discussed above. Various implementations of the source, intermediate, and/or object code and associated data may be stored in one or more computer readable storage media that include read-only memory, random-access memory, magnetic disk storage media, optical storage media, flash memory devices, and/or other suitable media. A computer-readable medium, in accordance with aspects of the present invention, refers to media known and understood by those of ordinary skill in the art, which have encoded information provided in a form that can be read (i.e., scanned/sensed) by a machine/computer/processor and interpreted by the machine's/computer's/processor's hardware and/or software. It is also to be appreciated that as used herein, the term "computer readable storage medium" excludes propagated signals, per se.

Turning back to FIG. 1, the supervisory computing station 118 is configured to retrieve data related to the system parameters from the PDC 116 and analyze the retrieved data in order to monitor voltage parameters in the power system 100. In other embodiments, the computing station 118 may be omitted, and the PDC 116 and/or other suitable computing devices (not shown) may perform at least some of the operations described below.

In operation, the PDC 116 receives measurement data from the PMUs 114 and other associated other various components of the power system 100. The PDC 116 can then compile and/or otherwise process the received measurement data to generate data related to the actual system parameters. For example, in one embodiment, the PDC 116 can "align" phasor measurements from the PMUs 114 based on corresponding time stamps with reference to the GPS satellite 110. In other embodiments, the PDC 116 can also sort, filter, average, and/or perform other operations on the received data. The PDC 116 can then provide at least one set of the generated actual system parameters at one instance to the computing station 118 for voltage analysis, using the methodologies disclosed herein.

Rule-Based Wide Area Fault Detection Method

Figure 2:
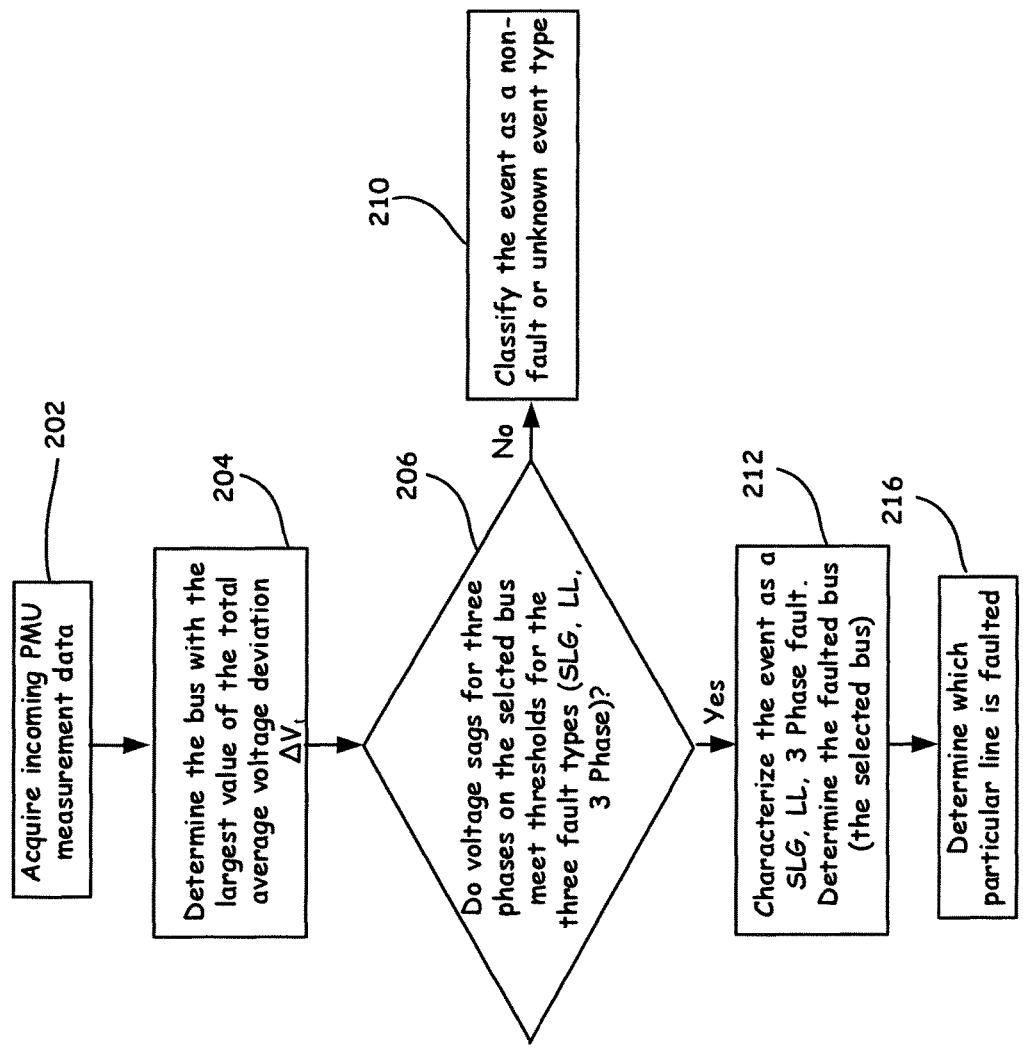
FIG. 2 shows a general functional flowchart of the wide area fault detection method using PMU Data embodiments of the present technology.

FIG. 2 shows a non-limiting-functional flowchart for utilizing the methods herein, as generally designated by the reference numeral 200. The example method, as generally shown in FIG. 2 and as discussed below, often includes the following three steps: 1) Identify one or more faulted buses; 2) Determine fault types; and 3) Detect a faulted line.

The novel method herein, as generally shown in FIG. 2, is thus configured to first acquire voltage measurements 202 and breaker ON/OFF status data collected from the power system using synchrophasor (PMU) and/or other associated technology. As an illustration, the computing station 118 of FIG. 1, gets raw data from syncrophasor devices, such as from the PMU's 114 shown configured with example transmission level substations 106, as shown in FIG. 1. While PMUs are generally preferred herein, other devices, such as, but not limited to SCADA devices, protective relays and meters, etc., as known in the art, can additionally be utilized to provide the raw data. In any configuration, values of voltage magnitude, voltage angle and/or other suitable parameters for all buses in a power system 100 are capable of being obtained. Accordingly, the methods herein are beneficially and in a novel manner integrated into existing infrastructure at a power control center, e.g., the computing station 118 of FIG. 1, as it receives data often from configured PMUs 114.

As part of step 1, the magnitude of three phase voltage phasors at each monitored bus are processed from, for example, synchrophasor measurement data. The voltage deviation of each phase is calculated, the total average voltage deviation, $\Delta V_t$ for three phases at a bus can be further determined using the calculated voltage deviation value of each phase. Once the total average voltage deviation $\Delta V_t$ (largest value) is obtained, it can be used to aid in identifying the potential faulted bus.

In the second step, two approaches, called ABC and symmetrical component methods, are utilized herein for fault type detection. Thresholds and rules are created for three types of common faults in power systems, single line-to-ground faults (SLG), Line to Line Faults (LL), and Three Phase Faults (ABC). In the third step, the faulted transmission line is detected using the magnitude of measured positive sequence current phasors. Hereinafter the steps as incorporated in the flow diagram of FIG. 2 is described.

Identify the Faulted Bus

To identify the faulted bus, the three phase total average voltage deviation ($\Delta V_t$) at each bus is chosen as the evaluation parameter, as denoted by reference numeral 204 in FIG. 2. Only the magnitude of voltage phasors measured by PMUs at monitored buses are used to calculate this parameter.

Typical power systems disturbances are short circuit faults and subsequent line trips, which can appear as voltage sags at various buses of the system. According to IEEE standard 1159-1995, a voltage sag is defined as a decrease in between 0.1 to 0.9 p.u. in rms voltage at the power frequency for a duration of 0.5 cycles of the power frequency but less than or equal to one minute. A voltage sag ($V_{sag}$) as disclosed herein, is thus the lowest point of the measured voltage magnitude for each phase during a fault for a particular bus. (Note: "p.u." or "pu" is an expression of power system values (per-unit system) as fractions of a defined base unit quantity, as known to those of ordinary skill in the art, for different equipment/components expressed as normalized values for simplification of power analysis of a system.

Such sag disturbances can be caused, for example, by switching operations associated with a temporary disconnection of supply, an undesired flow of inrush currents associated with the starting of motor loads, or a flow of fault currents. These events may result from the customers' system or from the public network and can cause deleterious effects on sensitive equipment, such as, for example, process-control equipment, adjustable-speed drives, programmable logic controllers, computers and diagnostic systems, etc. The fault itself might be located at the bus, or located at one of the several lines connected to the bus. A "faulted" bus, as defined herein, is a bus either physically faulted or closest to the fault location, and typically exhibits a maximum voltage deviation comparing to other buses in a power grid. For a fault event, at least one phase of three phases will have a voltage sag equal to or less than about 95%, which is the criterion disclosed herein. The methods herein are directed to locating such fault(s) meeting the criterion.

Accordingly, a method to calculate the maximum three phase total average voltage deviation ($\Delta V_{t\_Max}$) for this parameter is as follows:

1) Calculate the voltage sag ($V_{sag}$) at a bus. As part of such a calculation, the bus steady-state voltage value ($V_{ss}$) before the fault is utilized, as acquired in incoming PMU measurement data 202, as shown in FIG. 2.
2) Determine the voltage deviation of each phase. For a particular bus, the voltage deviation of each phase can be calculated as follows:

$$\Delta V_i = V_{ssi} - V_{sagi} \quad (1)$$

i=A,B,C representing three phases where $\Delta V_i$ is the voltage deviation at phase i, $V_{ssi}$ is the steady-state bus voltage before a fault at phase i, and $V_{sagi}$ is the lowest bus voltage magnitude value during a fault at phase i (i=Phases A, B or C).

3) Calculate the three phase total average voltage deviation $\Delta V_t$. The calculation method for this parameter is proposed as follows:

$$\Delta V_t = \frac{\sqrt{(\Delta V_A)^2 + (\Delta V_B)^2 + (\Delta V_C)^2}}{3} \quad (2)$$

where $\Delta V_A$, $\Delta V_B$, $\Delta V_C$ are voltage deviations for Phases A, B, and C, respectively, which are calculated from Equation (1). Considering there are total n monitored buses included in the wide-area power grid, the bus with the maximum three phase total average voltage deviation needs to be found as a potential faulted bus.

The maximum three phase total average voltage deviation, $\Delta V_{tmax}$, can be determined based on the three phase total average voltage deviation at each individual bus among n monitored buses as follows:

$$\Delta V_{tmax} = \max\{\Delta V_{tj}\}. \quad (3)$$

j=1, 2, . . . , n representing number of buses

To illustrate such identified faults, FIG. 3A, FIG. 3B, and FIG. 3C show plots of resultant voltage sag (grey bars indicate notable detected voltage sag time windows) using equations (1)-(3), for each phase for a SLG fault, a LL fault, and a three-phase fault based on measured synchrophasor data provided by Bonneville Power Administration (BPA)'s large power grid. Such synchrophasor data is information that is to be acquired shown in reference character 202, as shown in FIG. 2.

In particular, FIG. 3A shows a SLG fault (Note phase B 302 to ground fault), FIG. 3B shows a LL fault (Phases B-C 302, 304 fault), and FIG. 3C shows a three-phase fault (denoted as 302, 304, and 306 respectively). Even more particular so to illustrate the novel workings of the present technology, it is to be noted that in the plotted measured data in FIG. 3A, the voltage sag of V=0.68 pu for phase B 302 meets the threshold of equal to or less than 95% p.u., the criterion to be characterized as a detected fault. Similarly, FIG. 3B illustrates plotted measurement data for Phases B-C 302, 304 being equal to or less than 95% p.u. (i.e., V=0.70 pu and V=0.59 pu respectively) to meet the criterion. Finally FIG. 3C also illustrates a three phase fault detection based on all three phases, A, B, and C being less than 95% p.u. ((i.e., V=0.51 pu, V=0.70 pu, V=0.59 pu respectively), so as to meet the threshold criterion. Accordingly, by using equations (1)-(3) shown above, the maximum three phase total average voltage deviation for the whole network can be calculated for an event, and as a result, the bus with this value is identified to be the faulted bus.

To reiterate, this step is to identify a faulted bus. If the calculated voltage sags given by the above equations at any phase of a particular bus is equal to or less than 95%, then a potential fault event occurs as interpreted by the novel methodology herein.

Characterize Fault Type

Based on the computational result of the identified faulted bus, a determination is necessarily made at decision block 206, as shown in FIG. 2 to characterize the fault type. In particular, the methodology using methods discussed below (e.g., the ABC and Symmetrical Component Method) evaluates voltage sags for three phases on a selected bus and determines whether the evaluated sags meets thresholds for the three fault types (SLG, LL, 3 Phase). If the thresholds are not met (No, as shown in FIG. 2), then the method herein classifies the event as a non-fault or unknown event type (as denoted by operation box 210 in FIG. 2). If threshold are met or exceeded (Yes, as shown in FIG. 2), then the event, using the methods herein, is characterized as a SLG, a LL or a 3 Phase fault (as denoted by operation box 212 in FIG. 2).

It is to be noted that fault type characterization is arranged after the faulted bus identification because it might be affected by transformer connection while voltage sags propagate in the system. For example, a single-line-to-ground fault on the primary side of a delta/wye or wye/delta transformer can change into a line-to-line fault on the secondary side. Accordingly, two non-limiting methodologies are disclosed herein to determine fault types: an "ABC" method and a "symmetrical component" method, as discussed below. Thereafter which particular line is faulted is identified (as denoted by operation box 216 in FIG. 2) to be discussed below as well.

A. ABC Method

The ABC method uses only the magnitude of voltage phasors to create rules for the fault type identification based on the measured synchrophasor data at the PMU monitored buses. The thresholds for characterization of three common types of faults (SLG, LL and three phase faults) are set up based on: 1) characteristics of each type of fault and 2) the recorded fault events from a system power grid.

1) Characteristics and thresholds for SLG faults:
   Three-phase voltages are unbalanced. Voltage sag of one phase is significantly lower than that of other two phases. The phase with a SLG fault has a lower voltage sag value compared to other two healthy phases with their voltage sags close to 1 p.u. and almost equal to each other.

A range of the voltage sag for the phase with a SLG fault is often but not necessarily from 0 up to about to 0.95 p.u. The voltage sag value depends on practical situations such as how far the fault is actually located from the bus being monitored by a PMU. If the fault is located right at the bus, the voltage sag will be 0 p.u.; if the fault is remote to the bus, the voltage sag is often close to 0.95 p.u.

Thus, the rule requires one phase with the SLG fault will have a voltage sag below 0.95 p.u. with the other two "healthy phases" voltage sag values to be above 0.95 p.u.

2) Characteristics and thresholds for LL faults:

Three-phase voltages are unbalanced. Voltage sags of two phases are significantly lower than that of the $3^{rd}$ healthy phase, where the voltage sag is usually close to 1 p.u.

The typical range of voltage sags ($V_{sag}$ per phase) for the two phases with a LL fault is from 0.35 to 0.95 p.u. The typical range of the voltage sag ($V_{sag}$ per phase) for the phase without a LL fault is from 0.95 to 1.0 p.u.

Thus, the rule for a LL fault classification is that voltage sag values of two phases must lie in the range 0.35 to 0.95 p.u. while the remaining phase must have a voltage sag value larger than 0.95 p.u.

3) Characteristics and thresholds for three-phase faults:

Three-phase voltages are balanced. Voltage sags ($V_{sag}$ per phase) of three phases are close to each other if not exactly equal.

The typical range of voltage sags for all three phases is from 0 to 0.8 p.u.

Thus, the rule for characterization of a three phase fault is that all phases must have a voltage sag value in the range 0.0 to 0.8 p.u. and all voltage sags should be balanced with the relative unbalance value among three phases, $DV_{sag\_max}\%$, within 10%.

The relative unbalance of voltage sags among three phases, $DV_{sag\_max}\%$, can be calculated using the following three steps:

1) Calculate the average three phase voltage sag $V_{sag\_ave}$ using the $V_{sag}$ per phase as follows:

$$V_{sag\_ave} = \frac{V_{sagA} + V_{sagB} + V_{sagC}}{3} \quad (4)$$

where $V_{sagA}$, $V_{sagB}$, $V_{sagC}$ are voltage sags for Phases A, B, and C.

2) Calculate the maximum voltage sag deviation ($DV_{sag\text{-}max}$) for three phases based on the average three phase voltage sag, $V_{sag\_ave}$ The voltage sag deviation for each phase based on the average three phase voltage sag $V_{sag\_ave}$ can be calculated as follows:

$$DV_{sag\_A} = V_{sagA} - V_{sag\_ave} \quad (5)$$

$$DV_{sag\_B} = V_{sagB} - V_{sag\_ave} \quad (6)$$

$$DV_{sag\_C} = V_{sagC} - V_{sag\_ave} \quad (7)$$

The maximum voltage sag deviation ($DV_{sag\text{-}max}$) for three phases can be determined based on individual phases by $$DV_{sag\_max} = \max(\text{abs}(DV_{sag\_A}, DV_{sag\_B}, DV_{sag\_C})) \quad (8)$$

3) Calculate the unbalance of voltage sags among three phases in the form of the maximum voltage sag deviation in percent of the average three phase voltage sag $V_{sag\_ave}$ as follows:

$$DV_{sag\_max}\% = \frac{DV_{sag\_max}}{V_{sag\_ave}} \times 100\% \quad (9)$$

Once this percentage is obtained, the unbalance of voltage sags among three phases can be represented by the maximum voltage sag deviation value, $DV_{sag\_max}\%$. A comparison can be made between the calculated $DV_{sag\_max}\%$ value and the 10% threshold. As an illustrative example, if the voltage sags for a three phase fault are $V_{sagA}$=0.59 p.u., $V_{sagB}$=0.56 p.u., $V_{sagC}$=0.51 p.u. for Phases A, B and C, respectively, the voltage sag unbalance for three phases using Equations (4)-(9) can be determined as follows:

$$DV_{sag\_A} = V_{sagA} - V_{sag\_ave} = 0.59 - 0.553 = 0.037 \text{ p.u.}$$

$$DV_{sag\_B} = V_{sagB} - V_{sag\_ave} = 0.56 - 0.553 = 0.007 \text{ p.u.}$$

$$DV_{sag\_C} = V_{sagC} - V_{sag\_ave} = 0.51 - 0.553 = -0.043 \text{ p.u.}$$

$$V_{sag\_ave} = \frac{V_{sagA} + V_{sagB} + V_{sagC}}{3} = \frac{0.59 + 0.56 + 0.51}{3} = 0.553 \text{ p.u.}$$

$$DV_{sag\_max} = \max(\text{abs}(DV_{sag\_A}, DV_{sag\_B}, DV_{sag\_C}))$$

$$= \max(\text{abs}(0.037, 0.007, -0.043)) = 0.043 \text{ p.u.}$$

$$DV_{sag\_max}\% = \frac{DV_{sag\_max}}{V_{sag\_ave}} \times 100\% = \frac{0.043}{0.553} \times 100\% = 7.78\%$$

By comparing the calculated maximum voltage sag deviation value of 7.78% with the 10% threshold, it meets the set-up criterion.

B. Symmetrical Component Method

The symmetrical component method of the technology herein uses both magnitude and phase angle of the measured voltage phasors from synchrophasor data to serve as thresholds. Phase angle is a very important indicator for a power system fault event in. Positive, negative and zero sequence component voltage phasors, $(V_1, \theta_1)$, $(V_2, \theta_2)$ and $(V_0, \theta_0)$, can be calculated based on the measured three phase voltage phasors.

The peak magnitude for positive and negative sequence voltage phasors (typically occur during a fault), $\overline{V}_{1\_peak}$ and $\overline{V}_{2\_peak}$, are used in the fault characterization rules. Their variations between the steady-state value and the local peak values, $\Delta V_1$ and $\Delta V_2$, also serve as part of the rules.

The steady-state value refers to the voltage magnitude for a condition prior to a suspected fault. A symbol $\Delta$ in front of a parameter indicates that we are measuring the difference of that parameter from its steady-state value to its peak magnitude value.

The following are example rules for fault type identification using the symmetrical component method:

1) The fault will be a balanced three phase fault if the following rules are both satisfied:

Rule 1: The positive and negative sequence voltages measured at their respective local peaks satisfy:

$$\frac{|1\angle 0° - \overline{V}_{1\_peak}|}{|\overline{V}_{2\_peak}|} > 50.$$

Rule 2: The phase angles of the negative or zero sequence voltage phasors at the peak point experience large angle variation from the steady-state values: $\Delta\theta_2 > 100°$, or $\Delta\theta_0 > 100°$.
$|V_{0\_peak}| < 0.004$ p.u.

2) The fault is a LL fault if either Rule 1.1 or Rule 1.2 is satisfied and the remaining four rules are also satisfied:

Rule 1.1: The zero-sequence voltage is 0 p.u. in theory ($V_0 = 0$ p.u.) for a LL fault. Accordingly, the zero sequence voltage magnitude measured at the local peak is often small $|V_{0\_peak}| < 0.004$ p.u.

Rule 1.2: If the zero sequence voltage peak $|V_{0\_peak}| > 0.004$ p.u., check if the "voltage change in p.u." (from its steady-state value to its peak magnitude) of the zero sequence voltage ($\Delta V_0$) is smaller than the negative sequence voltage ($\Delta V_2$): $|\Delta V_0| < |\Delta V_2|$.

Rule 2: The phase angles of the negative and zero sequence voltage phasors at the peak point experience large angle variation from the steady-state values: $\Delta\theta_2 > 100°$, OR, $\Delta\theta_0 > 100°$.

Rule 3:

$$\frac{|1\angle 0° - \overline{V}_{1\_peak}|}{|\overline{V}_{2\_peak}|} < 50.$$

Rule 4: The ratio of "voltage change in p.u." of the positive ($\Delta V_1$) to negative ($\Delta V_2$) sequence voltage is small:

$$\left|\frac{\Delta V_1}{\Delta V_2}\right| < 3.$$

Rule 5: Any two phases have voltage sags larger than or equal to 0.1, i.e., any two among the following three are true: $|\Delta V_{A\_pu}| \geq 0.1$ p.u., $|\Delta V_{B\_pu}| \geq 0.1$ p.u., $|\Delta V_{C\_pu}| \geq 0.1$ p.u.

3) The fault is a SLG fault if either Rule 1.1 or Rule 1.2 is satisfied and the remaining four rules are also satisfied:

Rule 1.1: The "voltage change in p.u." of the zero sequence voltage ($\Delta V_0$) is larger than that of the negative sequence voltage ($\Delta V_2$): $|\Delta V_0| > |\Delta V_2|$.

Rule 1.2: If the "voltage change in p.u." of the zero sequence voltage ($\Delta V_0$) is less than that of the negative sequence voltage ($\Delta V_2$): $|\Delta V_0| < |\Delta V_2|$, and $$\left|\frac{\Delta V_2}{\Delta V_0}\right| < 4.$$

Rule 2: The phase angles of the negative or zero sequence voltage phasors at the peak point experience large angle variation from the steady-state values: $\Delta\theta_2 > 100°$, or $\Delta\theta_0 > 100°$.

Rule 3:

$$\frac{|1\angle 0° - \overline{V}_{1\_peak}|}{|\overline{V}_{2\_peak}|} < 50.$$

Rule 4: The ratio of "voltage change in p.u." of the positive ($\Delta V_1$) to negative ($\Delta V_2$) sequence voltage is small:

$$\left|\frac{\Delta V_1}{\Delta V_2}\right| < 3.$$

Rule 5: If only one phase has a voltage sag larger than or equal to 0.1, i.e., only one among the following three is true: $|\Delta V_{A\_pu}| \geq 0.1$ p.u., $|\Delta V_{B\_pu}| \geq 0.1$ p.u., $|\Delta_{C\_pu}| \geq 0.1$ p.u., then there is a SLG fault at that phase.

Detect Faulted Lines

To determine the faulted line (as denoted by operation box 216 in FIG. 2), the magnitude of positive sequence current phasors is used as the parameter for evaluation. When a short circuit fault occurs, the grid will feed the fault. Every line will experience current variation during fault before circuit breakers trip. Often, the current flowing through each phase of the faulted line has the largest sudden variation compared to other lines. However, for unbalanced SLG and LL faults, such current variation per phase may not translate directly into the positive sequence current. When only the positive sequence current phasor is available from PMU measurement data, the faulted line detection method herein is not used. in real-time applications. The following are three non-limiting cases for the fault clearing:

Case 1—A fault results in a three-phase circuit breaker trip. The fault current becomes zero after the breaker trips.

Case 2—A fault results in a hybrid circuit breaker trip: first a single-phase circuit breaker trips, then a three-phase circuit breaker trips. The fault current is first reduced and stabilized at a lower value, then becomes zero.

Case 3—A fault results in only one phase or two phase circuit breaker trip. The fault current is reduced and stabilized at a lower value.

FIG. 4A, FIG. 4B, FIG. 4C, and FIG. 5A and FIG. 5B illustrate application of the embodiments herein with respect to Case 1, Case 2, and Case 3 discussed above. Such resultant plots are also based on PMU measurement data in Bonneville Power Administration's (BPA's) power grid.

In particular, FIG. 4A illustrates Case 1 wherein the plot of Current "pu" 400 (Max current: $I_{max} = 2.20$ pu 401) versus Time shows a three-phase circuit breaker trip for a Phase B-to-ground fault as shown in FIG. 3A. FIG. 4B illustrates Case 2 wherein the Voltage versus Time plot illustrates Phase A-to-ground fault; and FIG. 4C illustrates Case 3 wherein the plot of Current "pu" 408 versus Time shows a positive sequence fault current at the fault location resulting in a hybrid trip with successful reclose (Max current: $I_{max} = 2.39$ pu 409 as also denoted by a sag time dashed line 410) and fault current reduced to a value due to protective device switching. FIG. 5A also illustrates Case 3 voltage per phase for Phase A-to-ground fault 502 and FIG. 5B shows Case 3 with the positive sequence fault current 508 ($I_{max} = 1.43$ pu 509) at the fault location resulting in a single pole of the breaker trip with successful reclose.

The methodology for the faulted transmission line detection comprises of the following four steps: Step 1): Survey line currents to take out the transmission lines without a stable steady-state positive sequence current value before a fault. This current value should not be 0. Only the transmission lines with a relative stable non-zero steady-state positive sequence current value for at least 20 cycles before a fault are considered for further evaluation. "Relative stable" means the current variation should be within ±10% based on the averaged steady-state value, $I_{ssl}$, which represents a line with a steady-state operation status. If the measured positive sequence current of a particular transmission line has this characteristic, it should remain for further evaluation and move to Step 2), otherwise, take it out of the consideration.

Step 2): Survey the measured positive sequence line currents to find out if the line current "reaches 0" during or after a fault period. The current "reaches 0" is defined as the lowest current value $I_{dip}$ during or after a fault period is less than 0.1 p.u. based on the steady-state current, $I_{ssl}$.

$$I_{dip} \leq 0.1 \text{ p.u.} \tag{10}$$

where $I_{dip}$ is the lowest magnitude of the positive sequence current during or after a fault period in per unit, and the base current value for this per unit value for $I_{dip}$ is $I_{ssl}$; $I_{ssl}$ is the steady-state current magnitude of the positive sequence currents measured by PMUs before a fault.

It is also to be noted that an auditory and/or user interface warning can be issued if a positive current of a line being measured has the following characteristics: 1) The lowest current value $I_{dip}$ (i.e., lowest current dip value) during or after a fault period is less than 0.1 p.u., then it can be concluded that the current at this line "reaches 0" and 2) The starting time to calculate and evaluate $I_{dip}$ is the starting time of a fault period. If both are satisfied and then as an additional embodiment, the characterized fault is triggers such an auditory and/or user interface warning. If any of the two items is not satisfied, move to Step 3) discussed below.

Step 3): Evaluate all transmission lines' positive sequence currents, for those lines their currents did not "reach 0" based on the criterion in Equation (10), conduct the following:

1) Determine the current variation for each transmission line. Calculate the peak current (the highest current spike) $I_{peak}$ during a fault (within a fault period) at each line, and determine the current variation ΔI as follows:

$$\Delta I = I_{peak} - I_{ssl} \tag{11}$$

where ΔI is current variation, $I_{peak}$ is peak current magnitude of the positive sequence current during the fault.

2) Find the transmission line with the maximum current variation. The maximum current variation among n transmission lines can be determined as follows:

$$\Delta I_{max} = \max\{\Delta I_i\} \ i=1,2,\ldots,n \tag{12}$$

3) If the transmission line with the maximum current variation experiences a sustained current dip $I_{dip}$ after the current spike, and it lasts at this low current value for at least 20 cycles, and the current value is smaller than 0.8 p.u. (the base current for the per unit current value is the steady-state current before fault, $I_{ssl}$):

$$I_{dip} < 0.8 \text{ p.u.} \tag{13}$$

If the above three items are satisfied, an auditory and/or user interface warning can be issued.

The embodiments herein will be more fully understood by reference to the following examples, which are intended to be illustrative of the present invention, but not limiting thereof.

Verification of the methods herein were conducted using synchrophasor data measured for 60 recorded fault events in BPA's large power grid. Fault type classification is 56 out of the 60 faulted cases (93% accuracy) for the Symmetric Components method and 59 out of 60 faulted cases (98% accuracy) for the ABC method. The faulted bus identification has an accuracy of 96%. The faulted line localization has an accuracy of 96%.

In a working embodiment herein, an event was recorded as tripped and reclosed single-pole on a Phase C to ground fault located at a 500 kV transmission line in BPA's power grid.

The three phase total voltage deviations for monitored buses were calculated using the proposed rule-based procedure and the results were listed in Table I. The faulted bus was identified as the bus with the maximum three phase total voltage deviation, which is Bus1 (shown bolded) in Table I shown below. The detected bus, using an embodiment herein, is the same bus that was recorded as the faulted bus in the field record.

TABLE I

Determine Faulted Bus Using Total Voltage Deviation for the Event Using voltage magnitude Measured from PMU Data

| Location | $\Delta V_t$ |
|---|---|
| Bus1 | 0.333261 |
| Bus2 - North Bus | 0.108509 |
| Bus2 - South Bus | 0.108508 |
| Bus3 - South Bus | 0.108502 |
| Bus3 - North Bus | 0.108499 |
| Identified faulted bus using the proposed method | Bus1 |
| Recorded faulted bus in the field record | Bus1 |

The next step, as disclosed above, is to classify the fault type at the location of the identified faulted bus (Bus 1) using, for example, the ABC method discussed above. The fault at this particular bus is classified to be a Phase C-to-ground fault, which agrees with the field recorded fault type as shown in Table II.

TABLE II

Determine Fault Type for the Event Using voltage magnitude Measured from PMU Data

| | |
|---|---|
| Voltage sag at Phase A | 0.98 p.u. |
| Voltage sag at Phase B | 0.99 p.u. |
| Voltage sag at Phase C | 0 p.u. |
| Voltage steady-state value at Phase A | 542.2 kV |
| Voltage steady-state value at Phase B | 543.01 kV |
| Voltage steady-state value at Phase C | 540.15 kV |
| Identified fault type using the proposed method | Phase C to ground fault |
| Recorded fault type in the field record | Phase C to ground fault |

The faulted line is further detected as the "Bus 1-Bus4 line" as shown in Table III, which matches the field record.

TABLE III

Determine Faulted Line for the Event Using current magnitude Measured from PMU Data

| | |
|---|---|
| Number of lines to examine based on faulted bus location | 18 lines |
| Number of lines with valid steady state (Step 1) | 16 lines |
| Number of lines "reaching 0" current (Step 2) | 0 lines |

TABLE III-continued

Determine Faulted Line for the Event Using
current magnitude Measured from PMU Data

| | |
|---|---|
| Relative height of current variation on faulted line compared to highest peaking non-faulted line | 7.63 p.u. vs. 2.05 p.u. |
| Duration of low current (<.8pu) on line experiencing highest peak | >40 cycles |
| Most likely location of faulted line | Bus1-Bus4 line |
| Rank of line with second highest peak experiencing a low current run for 20 cycles | 13 |
| Identified faulted line using the proposed method | Bus1-Bus4 line |
| Recorded fault line in the field record | Bus1-Bus4 line |

It is to be understood that features described with regard to the various embodiments herein may be mixed and matched in any combination without departing from the spirit and scope of the invention. Although different selected embodiments have been illustrated and described in detail, it is to be appreciated that they are exemplary, and that a variety of substitutions and alterations are possible without departing from the spirit and scope of the present invention.

We claim:

1. A method for wide-area real time line fault detection in a power grid system, the power grid comprising a plurality of phasor measurement units (PMUs) and other sensors individually coupled to various system components of the power grid and supervisory control and data acquisition facilities, the method comprising:

(a) using the PMUs to measure one or more current phasors and one or more voltage phasors at a monitored bus of a load center of the supervisory control and data acquisition facilities, wherein the supervisory control and data acquisition facilities include a logic processor device; and (b) using the logic processor device of the supervisory control and data acquisition facilities to:
take out transmission lines without a stable steady-state positive sequence current value;
acquire the measured one or more current and voltage phasors obtained from the PMUs;
identify an event as one or more faulted buses in the power system via calculating a maximum three phase total average voltage deviation ($\Delta V_i$), wherein a magnitude of the one or more measured voltage phasors is utilized to calculate the maximum three phase total average voltage deviation ($\Delta V_i$);
determine the event as one or more fault types using at least one methodology selected from: a first method that uses the magnitude of the one or more voltage phasors and a second method that uses both the magnitude and a phase angle of the measured one or more voltage phasors, wherein the first method and the second method enables determination of the one or more fault types with at least one fault type selected from: single line-to-ground faults (SLG), line-to-line faults (LL), and three-phase faults;
detect the one or more faulted lines using the magnitude of positive sequences of the one or more current phasors as the parameter; and
issue an auditory and/or user interface warning concerning the one or more faulted lines detected.

2. The method of claim 1, wherein calculation of the maximum three phase total average voltage deviation ($\Delta V_i$) to identify the event further comprises:
calculating a voltage sag ($V_{sag}$) at a bus;
determining a voltage deviation of each phase using ($\Delta V_i$)=$V_{ssi}$-$V_{sagi}$; and
thereafter calculating the three phase total average voltage deviation $\Delta V_i$, using:

$$\Delta V_t = \frac{\sqrt{(\Delta V_A)^2 + (\Delta V_B)^2 + (\Delta V_C)^2}}{3}. \qquad (2)$$

3. The method of claim 1, wherein the first method that uses the magnitude of the one or more voltage phasors to determine the one or more faulted lines further comprises:
determining the single line-to-ground faults (SLG) via a threshold that requires a first phase to have one or more voltage sag values to be less than 0.95 per-unit (p.u.) with a second and a third phase to have one or more voltage sag values to be above 0.95 per-unit (p.u.).

4. The method of claim 1, wherein the first method that uses the magnitude of the one or more voltage phasors to determine the one or more faulted lines further comprises:
determining the line-to-line faults (LL) via a threshold that requires one or more voltage sag values from two of the three phases selected from a first phase, a second phase, and a second phase to be in a range between 0.35 per-unit (p.u.) and 0.95 per-unit (p.u.).

5. The method of claim 1, wherein the first method that uses the magnitude of the one or more voltage phasors to determine the one or more faulted lines further comprises:
determining the three-phase faults via a threshold that requires all three phases selected from a first phase, a second phase, and a second phase to have one or more voltage sag values to be in a range between 0.0.0 per-unit (p.u.) and 0.8 per-unit (p.u.) and wherein all voltage sags among the three phases have a value within 10% of a defined unbalanced threshold using:

$$DV_{sag\_max} \% = \frac{DV_{sag\_max}}{V_{sag\_ave}} \times 100\%.$$

6. The method of claim 1, wherein the second method that uses both the magnitude and the phase angle of the measured one or more voltage phasors to determine the one or more faulted lines further comprises:
determining the single line-to-ground faults (SLG) by satisfying at least one of the following: a voltage change in per-unit (p.u.) of a zero sequence voltage ($\Delta V_0$) is larger than that of a negative sequence voltage ($\Delta V_2$):$|\Delta V_0|>|\Delta V_2|$, and if the "voltage change in per-unit p.u." of the zero sequence voltage ($\Delta V_0$) is less than that of the negative sequence voltage ($\Delta V_2$): $|\Delta V_0|<|\Delta V_2|$, and $$\left|\frac{\Delta V_2}{\Delta V_0}\right| < 4$$

and
the following all are satisfied including: the phase angles of the negative or zero sequence voltage phasors at the peak point have an angle variation from the steady-state values that satisfies $\Delta\theta_2 > 100°$ or $\Delta\theta_2 > 100°$, and using $$\frac{|1\angle 0° - \overline{V}_{1\_peak}|}{|\overline{V}_{2\_peak}|} < 50$$

and
   a ratio of "voltage change in per-unit (p.u.) of a positive first ($\Delta V_1$) to negative second ($\Delta V_2$) sequence voltage is provided satisfying $$\left|\frac{\Delta V_1}{\Delta V_2}\right| < 3$$

and if only one phase has a voltage sag of at least 0.1.

7. The method of claim 1, wherein the second method that uses both magnitude and phase angle of the measured one or more voltage phasors to determine the one or more faulted lines further comprises:
   determining a line-to-line fault (LL) by satisfying at least one of the following: a zero-sequence voltage magnitude measured at a local peak is obtained that satisfies $|V_{0\_peak}| < 0.004$ p.u.
wherein if the zero sequence voltage peak $|V_{0\_peak}| > 0.004$ p.u., determine if the zero sequence voltage ($\Delta V_0$) is less than the negative sequence voltage ($\Delta V_2$) based on: $|\Delta V_0| < |\Delta V_2|$, and
   the following all are satisfied including: the phase angles of one or more negative and zero sequence voltage phasors at the peak point have an angle variation from the steady-state values: $\Delta\theta_2 > 100°$, OR, $\Delta\theta_0 > 100°$, and $$\frac{|1\angle 0° - \overline{V}_{1\_peak}|}{|\overline{V}_{2\_peak}|} < 50,$$

and
the ratio of "voltage change in p.u." of the positive ($\Delta V_1$) to negative ($\Delta V_2$) sequence voltage is small:

$$\left|\frac{\Delta V_1}{\Delta V_2}\right| < 3,$$

and
   any two phases have voltage sags of at least 0.1.

8. The method of claim 1, wherein the second method that uses both magnitude and phase angle of the measured one or more voltage phasors to determine the one or more faulted lines further comprises:
   determining a balanced three phase fault if the following are both satisfied: a positive and a negative sequence of voltages measured at their respective local peaks satisfy:

$$\frac{|1\angle 0° - \overline{V}_{1\_peak}|}{|\overline{V}_{2\_peak}|} > 50;$$

and
   the phase angles of the negative or zero sequence voltage phasors at the peak point have a large angle variation from the steady-state values based on: $\Delta\theta_2 > 100°$, or $\Delta\theta 0 > 100°$.

9. A wide-area real time line fault detection computing system, comprising:
   a logic processor device in supervisory control and data acquisition facilities of a power grid system;
   a plurality of phasor measurement units (PMUs) and other sensors individually coupled to various system components of the power grid;
   a memory operatively coupled to the processor, the memory containing instructions that when executed by the processor causes the logic processor device to perform a process including:
   acquiring measurements from said plurality of PMUs and other sensors at a monitored bus of a load center configured within the power grid system;
   take out transmission lines without a stable steady-state positive sequence current value;
   identifying an event as one or more faulted buses in the power system via calculating a maximum three phase total average voltage deviation ($\Delta V_i$), wherein the magnitude of the one or more measured voltage phasors is utilized to calculate the maximum three phase total average voltage deviation ($\Delta V_i$);
   determining the event as one or more fault types using at least one methodology selected from: a first method that uses the magnitude of the one or more voltage phasors and a second method that uses both the magnitude and a phase angle of the measured one or more voltage phasors, wherein the first and the second method enables determination of the one or more fault types with at least one fault type selected from: single line-to-ground faults (SLG), line-to-line faults (LL), and three-phase faults;
   detecting the one or more faulted lines using the magnitude of positive sequences of the one or more current phasors as the parameter; and
   issue an auditory and/or user interface warning concerning the one or more faulted lines detected.

\* \* \* \* \*